United States Patent
Borges-Machado et al.

(10) Patent No.: US 12,428,335 B2
(45) Date of Patent: Sep. 30, 2025

(54) COLORED WATCH GLASS

(71) Applicant: ROLEX SA, Geneva (CH)

(72) Inventors: Maria-Isabel Borges-Machado, Thonex (CH); Alexandra Roulet, Geneva (CH)

(73) Assignee: ROLEX SA, Geneva (CH)

( * ) Notice: Subject to any disclaimer, the term of this patent is extended or adjusted under 35 U.S.C. 154(b) by 573 days.

(21) Appl. No.: 16/791,453

(22) Filed: Feb. 14, 2020

(65) Prior Publication Data

US 2020/0262740 A1   Aug. 20, 2020

(30) Foreign Application Priority Data

Feb. 18, 2019 (EP) ..................... 19157748

(51) Int. Cl.
*C03C 4/02*    (2006.01)
*C30B 29/20*   (2006.01)
*C30B 33/02*   (2006.01)
*C30B 33/08*   (2006.01)

(52) U.S. Cl.
CPC ............... *C03C 4/02* (2013.01); *C30B 29/20* (2013.01); *C30B 33/02* (2013.01); *C30B 33/08* (2013.01)

(58) Field of Classification Search
CPC ... C03C 14/006; C03C 21/007; C03C 21/008; C03C 2214/16; C03C 2214/20; C03C 2214/30; C03C 4/02; C23C 14/0015; C30B 29/20; C30B 31/00; C30B 31/02; C30B 33/02; C30B 33/08; G04B 39/00
See application file for complete search history.

(56) References Cited

U.S. PATENT DOCUMENTS

| | | | |
|---|---|---|---|
| 2003/0027000 A1 | 2/2003 | Greenberg et al. | |
| 2009/0246370 A1 | 10/2009 | Gupta et al. | |
| 2011/0200760 A1 | 8/2011 | Park et al. | |
| 2011/0251293 A1 | 10/2011 | Trummer et al. | |
| 2014/0248472 A1* | 9/2014 | Memering | C30B 29/20 |
| | | | 427/523 |
| 2016/0062405 A1 | 3/2016 | Mylvaganam et al. | |
| 2017/0114442 A1* | 4/2017 | Guernalec | G02B 1/113 |
| 2020/0387001 A1 | 12/2020 | Cavalca et al. | |

FOREIGN PATENT DOCUMENTS

| | | | | |
|---|---|---|---|---|
| EP | 3450594 A1 | 3/2019 | | |
| JP | H09-048626 A | 2/1997 | | |
| JP | 2001150898 A | * 6/2001 | ............... | B44F 1/04 |

(Continued)

OTHER PUBLICATIONS

European Patent Office, English computer translation of JP 2009-216452 (Year: 2022).*

(Continued)

*Primary Examiner* — Matthew J Song (74) *Attorney, Agent, or Firm* — Seckel IP, PLLC (57) ABSTRACT

A transparent timepiece component, in particular a watch glass, has a substantially planar or curved interior surface, and has mainly a transparent material colored by a zone of modified chemical composition within the component through an introduction of at least one coloring chemical element of the transparent material, this zone of modified chemical composition extending in one part only of the total thickness of the timepiece component.

17 Claims, 7 Drawing Sheets

(56) References Cited

FOREIGN PATENT DOCUMENTS

| | | | | |
|---|---|---|---|---|
| JP | 2004-352561 A | 12/2004 | | |
| JP | 2006248044 A | 9/2006 | | |
| JP | 2009-186226 A | 8/2009 | | |
| JP | 2009216452 A | * | 9/2009 | ............ G04B 39/00 |
| JP | 2014-185047 A | 10/2014 | | |
| JP | 2016511214 A | 4/2016 | | |
| JP | 3213040 U | 10/2017 | | |
| WO | 2009/151160 A1 | 12/2009 | | |
| WO | 2012013787 A2 | 2/2012 | | |
| WO | 2014137462 A1 | 9/2014 | | |
| WO | 2016033253 A1 | 3/2016 | | |
| WO | 2017187647 A1 | 8/2018 | | |
| WO | 2018172350 A1 | 9/2018 | | |
| WO | 2018178858 A1 | 10/2018 | | |

OTHER PUBLICATIONS

European Patent Office, English computer translation of JP 2001-150898 (Year: 2022).*

European Search Report and Written Opinion dated Aug. 29, 2019 issued in counterpart application No. EP19157748; w/ English machine translation (total 17 pages).

Marques et al., "Optical changes induced by high fluence implantation of Co ions on sapphire", Surface and Coatings Technology, vol. 158-159, 2002, pp. 54-58 (in English; cited in the ESR).

Saito et al., "Coloration of sapphire by Co ion implantation", Nuclear Instruments and Methods in Physics Research, Section B, vol. 59-60, 1991, pp. 1173-1176 (in English; cited in the ESR).

Saito et al., "Coloration of Sapphire by Metal-Ion Implantation", Japanese Journal of Applied Physics, vol. 24, No. 11, Nov. 1985, pp. L880-L882 (in English; cited in the ESR).

Japanese Office Action dated Jan. 9, 2024 in counterpart application No. JP 2020-022566; w/ English translation (total 17 pages).

Chinese Office Action and Search Report dated Dec. 30, 2022 in counterpart application No. CN 202010096712.3; w/ English machine translation (total 20 pages).

JP Office Action dated Aug. 6, 2024 in counterpart application No. JP 2020-022566; w/ English machine translation (total 19 pages).

* cited by examiner

COLORED WATCH GLASS

This application claims priority of European patent application No. EP19157748.5 filed Feb. 18, 2019, the content of which is hereby incorporated by reference herein in its entirety.

INTRODUCTION

The present invention relates to a transparent and colored timepiece component, in particular a watch glass. The invention also relates to a timepiece, such as a watch, comprising such a timepiece component. It also relates to a process for manufacturing a timepiece component, comprising in particular a phase of coloring a transparent substrate.

PRIOR ART

A watch glass made of sapphire is by nature transparent and colorless, and it is sometimes desired to modify its appearance in order to make it colored.

For that, a process exists for synthesizing sapphire while simultaneously coloring it. This process produces a ball of sapphire, which is colored in the mass, from which watch glasses are subsequently cut. Such a process is, for example, described in document WO 2017/187647. This prior art solution has many drawbacks:
- it requires a complex study at the time of each color change;
- it does not make it possible to partially color the component, nor to combine several colors;
- it is not compatible with certain colors, which cannot be obtained, or with a rendering of insufficient quality; it may thus be incompatible with a timepiece application.

In addition to the above remarks, it should be specified that any process for manufacturing a timepiece component must observe numerous constraints and that the modification of a process for integrating a coloring step must not degrade the overall quality of the timepiece component obtained. For example, in the case of a watch glass, the following timepiece requirements must be observed:
- the glass must have a transparency sufficient for it to be possible for the time to be read;
- the glass must have a high overall mechanical strength, and also a surface scratch resistance;
- the coloring of such glass must make it possible to achieve a predictable and repeatable result;
- the color perceived must have a rendering of quality, without defect, with perfect homogeneity or with a precise heterogeneous distribution according to a predefined choice;
- the color obtained must be suitable for the watch, in particular for the dial that will be visible through the glass.

These technical problems also apply to other transparent timepiece components, in particular having a substantially planar shape, in particular having a substantially planar or curved interior surface and/or being made of a mineral material, such as sapphire or glass.

The general objective of the invention is to obtain a solution for obtaining a transparent and colored timepiece component, which does not comprise all or some of the prior-art drawbacks.

More particularly, an object of the invention is to obtain a transparent and colored timepiece component solution making it possible to achieve a repeatable and precise visual appearance of great quality.

BRIEF DESCRIPTION OF THE INVENTION

To this effect, the invention is based on a transparent timepiece component, in particular a watch glass, wherein it comprises a substantially planar or curved interior surface, and wherein it comprises mainly a transparent material colored by a zone of modified chemical composition within said component through an introduction of at least one coloring chemical element to said transparent material, this zone of modified chemical composition extending in only one part of the total thickness of the timepiece component. Advantageously, this zone of modified chemical composition does not extend in the entire volume of the timepiece component. More advantageously, it does not extend over its entire thickness. More advantageously, it extends over a small part of its thickness and/or of its volume.

The invention also relates to a process for manufacturing a colored and transparent timepiece component, wherein it comprises the following steps:
a. provision of an initial substrate which comprises a substantially planar or curved interior surface composed mainly of a transparent material;
b. introduction of at least one coloring chemical element by at least one exterior or interior surface of said initial substrate;
c. heat treatment of said substrate resulting from the introduction step comprising at least one coloring chemical element, so as to obtain a transparent and colored piece.

Advantageously, the introduction step comprises the depositing of a coating comprising the at least one coloring chemical element.

The invention is more specifically defined by the claims.

BRIEF DESCRIPTION OF THE FIGURES

These objects, features and advantages of the invention will be set out in detail in the following description of a particular embodiment given in a nonlimiting manner in relation to the appended figures, in which.

In order for the description to flow, the same references will be used for the different implementation variants for denoting features which are identical or equivalent.

Furthermore, to simplify the following description, the adjective "exterior" will denote a volume or a surface of a timepiece component intended to face toward the exterior of a timepiece, in particular including a volume or a surface directly visible to an observer looking at the timepiece. Conversely, the adjective "interior" will denote a volume or a surface of a timepiece component intended to face toward the interior of a timepiece. Improperly, the use of the adjectives "exterior" and "interior" will be extended to a component that was entirely placed inside a timepiece, its exterior surface then being that which would be positioned closest to the exterior limit of the timepiece.

Furthermore, the adjective "transparent" will be used to denote the property of a material when the material in question brings about a transmission, evaluated by the transmission factor Y, greater than 68% inclusive, or even greater than 79% inclusive, of a light radiation comprising at least wavelengths in the visible range. The term "transparent material" will be considered to mean a material of which the nature, combined with the thickness used, allows the at least partial transmission of the abovementioned light radiation. Advantageously, the transparent material used also allows an at least partial transmission of radiation comprising wavelengths in the ultraviolet range.

An embodiment of the invention of a process for manufacturing a sapphire glass of a timepiece will now be described. This same process will be applicable to other timepiece components, as will be detailed in the remainder of the text. This manufacturing process comprises the following two main steps, which form a coloring phase or a coloring process, subsequent to a prior step of provision E0 of a transparent substrate, that is to say a substrate comprising mainly a transparent material:

- introduction E1 of at least one coloring chemical element on at least one exterior or interior surface of said substrate, otherwise referred to as initial substrate, provided;
- heat treatment E2 of said substrate resulting from the introduction step, comprising the at least one coloring chemical element, so as to obtain a transparent and colored piece.

As mentioned above, the process carries out a prior step of provision E0 of an initial substrate 10. This substrate advantageously has a substantially planar shape, comprising an exterior surface, intended to face toward the exterior of a timepiece, and a substantially planar or curved interior surface, intended to face toward the interior of a timepiece. This substrate is advantageously made entirely of a transparent material. This transparent material may be colorless. As a variant, it may be colored. The process could, however, be applied to a transparent portion of a substrate that is only locally transparent.

In the embodiment, the transparent material is sapphire, more specifically a monocrystalline synthetic alumina. As a variant, the material could be any other transparent material composed at least partially of inorganic and/or mineral matter, such as glass (borosilicate, photostructurable, etc. glass), corundum, alumina, yttrium aluminum garnet (YAG), glass-ceramic and/or monocrystalline or polycrystalline ceramic. The transparent material may also be colored alumina or any other transparent material mentioned above that has been colored beforehand.

The initial substrate additionally advantageously has a shape identical to that of the future glass, or even a similar shape, which may be modified by subsequent steps, for example machining. The substrate additionally advantageously has a surface finish identical to that of the future glass. Its exterior and/or interior surface is preferably polished. As a variant, it may have another surface finish, in particular locally.

The exterior and/or interior surface may be planar. As a variant, it may be curved, for example concave or convex. It may be curved and preferably continuous, that is to say not composed of juxtaposed facets. However, it may comprise a bevel or a chamfer, in particular at the level of its peripheral part, as will be subsequently detailed.

As a variant, at least one interior or exterior surface may comprise features, which may in particular show time indications or indications derived from time, which are for example machined, forming structured zones which are raised and/or set back.

FIGS. 1a to 1e illustrate examples of substrates, referred to as initial substrates, proposed in a prior step, with a view to manufacturing a watch glass, according to several implementation variants.

Figure 1A:
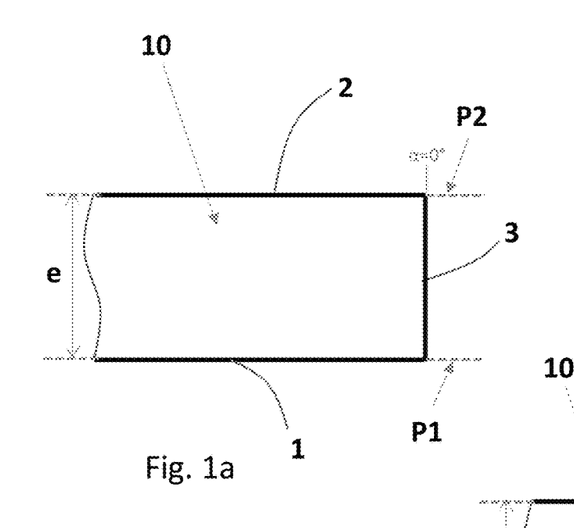
FIGS. 1a to 1e diagrammatically represent sectional views in the thickness of substrates which are precursors of the timepiece components, according to several variants of the embodiment of the invention.

FIG. 1a thus represents an initial substrate 10 according to a first variant comprising a planar exterior surface 2 forming a plane P2, parallel to a planar interior surface 1 forming a plane P1. The substrate furthermore comprises, at the periphery, a flank 3, forming a planar cylindrical third surface which extends from the exterior surface 2 to the interior surface 1, perpendicular to these two surfaces, around the entire perimeter of the substrate. The total thickness e of the initial substrate is defined as the distance between the exterior surface 2 and the interior surface 1. In particular, the total thickness e is measured perpendicular to the interior surface 1 in a direction p perpendicular to the plane P1, in particular to the planes P1, P2. The substrate may of course have any shape, advantageously corresponding to the future timepiece on which it will be mounted, for example circular, ellipsoidal, rectangular, etc. It advantageously has an interior surface which has an area greater than or equal to 20 mm$^2$, with a view to the manufacture of a single eyeglass or a magnifying lens, or greater than or equal to 80 mm$^2$, or even greater than or equal to 200 mm$^2$, or even greater than or equal to 300 mm$^2$, with a view to the manufacture of a watch glass.

Figure 1B:
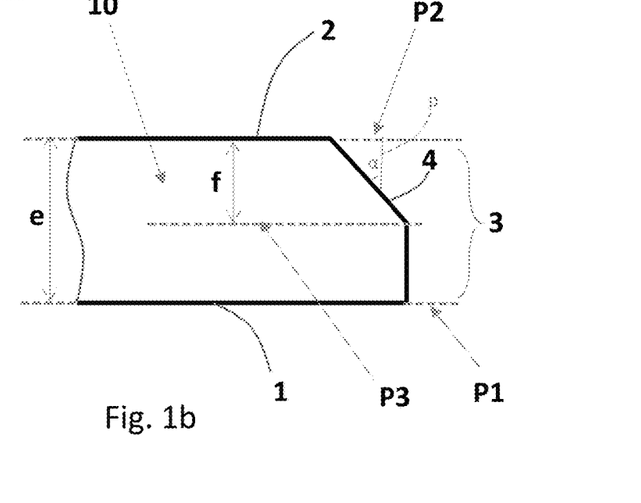

FIG. 1b represents an initial substrate 10 according to a second variant, which differs from the substrate of the first variant in that the flank 3 comprises a part 4 forming a bevel made at the periphery of its exterior surface 2. This beveled part 4 is truncated and extends between the exterior surface 2 and the remainder of the flank 3 (between the plane P2 and an intermediate plane P3 parallel to the plane P2). The remainder of the flank 3 is still perpendicular to the interior surface 1. Advantageously, this beveled part extends around the entire perimeter of the substrate. The beveled part 4 extends over a thickness f of the substrate, measured perpendicular to the planes P2, P3, which corresponds approximately to slightly less than half the total thickness e of the substrate. Preferably, the thickness f is between 0.07 and 0.6 times the total thickness e of the substrate. The beveled part 4 forms a constant angle α with the direction p. Advantageously, the angle α is between 30° and 80°. Alternatively, the angle α and/or the thickness f could vary around the circumference of the glass.

Figure 1C:
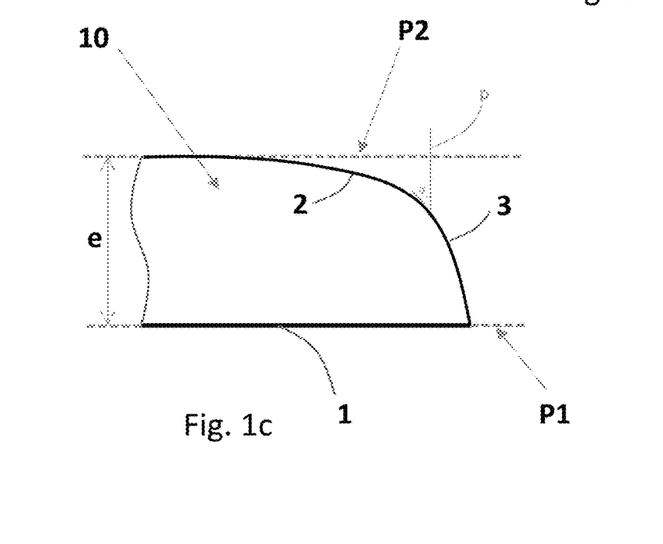

FIG. 1c represents an initial substrate 10 according to a third variant, which forms an intermediate solution between the above two variants. The at least partly planar flank 3 is replaced by a curved flank 3, which links the two exterior and interior surfaces by a continuous curve. The curve forming the flank 3 can be characterized at each point by an angle α defined by the angle between the tangent of said curve and the direction p. This angle α is variable, but remains greater than 30° on a first part of the flank 3, on the side of the exterior surface 2. The remainder of the curve forming the flank 3, on the side of the interior surface 1, may be perpendicular or substantially perpendicular to the interior surface 1, with an angle α equal to 0° or tending toward 0°. This first part of the flank 3 is similar to the beveled surface 4 of the second variant.

Figure 1D:
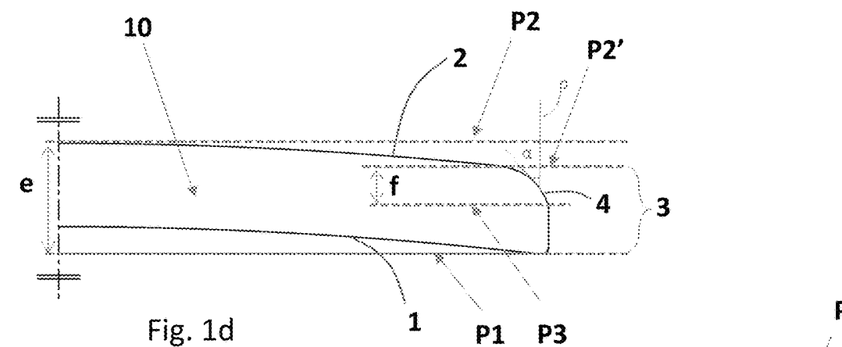

Figure id represents an initial substrate 10 according to a fourth variant, in which the two exterior 2 and interior 1 surfaces are curved, in one and the same parallel shape. The exterior wall is symmetrically arranged about a central axis and the apex is defined as being the outermost point of the exterior surface 2, and the plane P2 as being the plane tangent to this curved exterior surface 2 and passing through this apex. The plane P2 thus corresponds to the outermost plane of the exterior surface 2. Likewise, the innermost points of the interior surface 1, that is to say the points defining the periphery of the interior surface, can define a plane P1 tangent to the interior surface 1, and which is parallel to the plane P2. The direction p is defined as the direction perpendicular to the plane P1, in particular to the planes P1, P2. The total thickness e of the substrate then remains defined as the distance between the two planes P1, P2, the total thickness e being measured perpendicular to the plane P1, along the direction p. The flank 3 constitutes the peripheral surface which links the two surfaces. This flank 3 comprises a curved first part 4, at the level of the exterior surface 2, extended by a part perpendicular to the planes P1, P2 up to the interior surface 1. The curved first part 4 extends overall between planes P2' and P3, which are parallel to the planes P1, P2, and has a thickness f, measured perpendicular to the planes P2', P3 that is strictly less than the total thickness e. Alternatively, a substrate with a planar interior surface 1 and geometric criteria which are moreover equivalent to those of figure id can be envisioned.

Figure 1E:
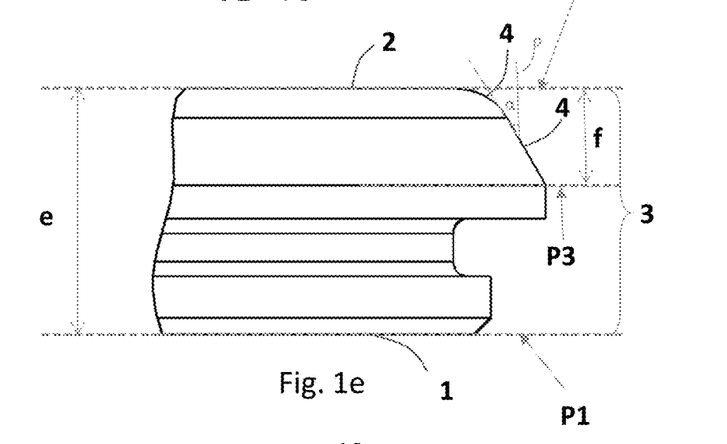

FIG. 1e represents an initial substrate 10 according to a fifth variant, in which the two exterior 2 and interior 1 surfaces are planar and parallel. The flank 3 comprises a first part corresponding to a bevel 4, similar to that of the second variant, and a second part comprising a groove. This flank also comprises some rounded corners.

In any case, the total thickness e of the initial substrate 10, and thus of the watch glass, is comprised between 0.2 mm and 15 mm, or even between 0.85 mm and 15 mm, or even between 1.45 mm and 11 mm. Furthermore, regardless of the geometric configurations of the glass, an angle α of a flank 3, greater than or equal to 10°, preferentially greater than or equal to 15°, or even greater than or equal to 30°, will make it possible to achieve a visual effect corresponding to color modulation. Furthermore, regardless of the geometric configurations of the glass, the particular part 4 of the flank 3 can have a variable area compared with the area of the interior surface 1, and can represent from 1% to 30% of this interior surface 1, or even between 1% and 18%, or even preferably between 10% and 18% of this interior surface 1.

When the substrate is provided at the outcome of this prior step, the manufacturing process then carries out the two main steps of the process, which form an initial-substrate coloring phase.

The first step consists in introducing E1 at least one coloring chemical element.

According to a first implementation variant, this introduction is carried out by depositing a coating comprising the at least one coloring chemical element on at least one of the two interior or exterior surfaces of the initial substrate.

To do that, this coating can be deposited by one of the following processes:
 physical vapor deposition (PVD), and in particular magnetron sputtering (MS); or
 physical vapor deposition (PVD), and in particular thermal evaporation; or
 chemical vapor deposition (CVD); or
 atomic layer deposition (ALD); or
 liquid deposition of spin-coating, dip-coating or sol-gel type.

In a second implementation variant, this introduction is carried out by recoil ion implantation, in particular in the case where the diffusion in the substrate of the coloring chemical element introduced in the form of a coating is slow or requires too high a temperature. The term "recoil ion implantation" is intended to mean a deposition of a thin coating composed of the at least one coloring chemical element by PVD, CVD and/or ALD, combined with ion implantation of said coating by bombardment with a gas such as argon and/or nitrogen and/or oxygen.

Figure 2A:
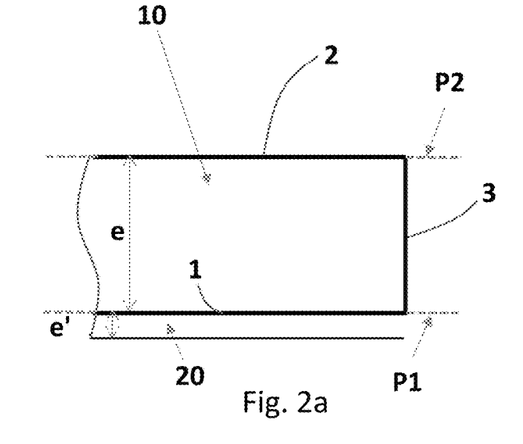
FIGS. 2a and 2b diagrammatically represent sectional views in the thickness of a substrate which is a precursor of a timepiece component, respectively after implementation of a first manufacturing step then of a second manufacturing step of the manufacturing process according to the embodiment of the invention.

In these variants of introduction of at least one coloring chemical element, a coating is produced on at least one of the surfaces of the initial substrate, in particular on at least one of the exterior or interior surfaces. This coating can be homogeneous or can consist of a superposition of layers composed of various elements. FIG. 2a represents the result obtained after introduction of a coating 20 on the interior surface 1 of the substrate. This step makes it possible to deposit a coating thickness e' very precisely. The coating thickness e' can be between 1 nm and 10 μm, in particular between 1 nm and 1 μm. This thickness e' makes it possible to define the future color and also the resulting transparency of the colored transparent piece, in particular of the watch glass. There will thus be a compromise. A coating thickness that is too small does not make it possible to perform the coloring; this defines the lower limit of the thickness e'. A thickness which is too great does not make it possible to preserve a sufficient transparency of the substrate; this defines the upper limit of the thickness e'. This thickness range depends on the coloring chemical element, on the transparent material of the substrate, and on the heat treatment that will be applied, detailed hereinafter.

Furthermore, the coating may be uniform, that is to say of constant thickness over the entire surface of the substrate, so as to achieve a homogeneous result. As a variant, it may be desired to obtain a heterogeneous result; in this case, it is possible for the coating to be non-uniform.

For example, the coating may be discontinuous. For that, the process comprises a prior step consisting in depositing a mask, for example a resin, on the surface(s) on which the coating is introduced, so as to obtain only a partial coating, outside the masked zones. Next, after application of the coating, the mask is removed. The masking may be more or less dense, so as to form a color gradient as a function of the masking density.

An alternative could consist in coating the surface of the substrate without taking into account the features and removing the layer selectively so as to draw the features.

For example, it is possible to obtain the deposition of a coating of variable thickness by means of a directional vacuum method, such as MS PVD deposition. A thickness gradient of a coating 20 can be obtained by inclining the substrate during the deposition or by suitable masking or any other suitable approach.

As an alternative, the introduction of the at least one coloring chemical element can be carried out by direct ion implantation, without the involvement of a coating. The drawback of the latter alternative lies in the difficulty in controlling the amount of coloring chemical elements that may be introduced into the substrate, and in the difficulty in obtaining a precise definition of a feature by masking.

Preferentially, the introduction of the at least one coloring chemical element is carried out on a single interior or exterior surface of the substrate. As a variant, this introduction can be carried out on the two interior and exterior surfaces, or even on all or part of the flank 3.

The coloring chemical element may be chosen from the following nonexhaustive list:
- a metal element, chosen in particular from transition metals; or
- an oxide, in particular a metal oxide, formed in particular from transition metals; or
- a metal alloy; or
- a metalloid, a non-metal or a gas.

The coloring chemical element is combined with the material of the substrate so as to obtain a desired color. In particular, for blue coloring of an alumina substrate, it is known practice to use cobalt. Of course, the coloring elements such as iron, titanium, gold, chromium, vanadium, copper, manganese, magnesium, zinc, silver, boron, nitrogen, etc., can be used to obtain other colors, alone or in combination. Thus, it is possible to combine several distinct elements, for example several coloring chemical elements among the above list. For example, an addition of chromium or gold to alumina can give a red color, and combined additions of titanium and iron can give blue.

It should be noted that, before the step of introducing the coloring chemical element(s), the process advantageously comprises a step of cleaning the substrate. The cleaning can consist of detergent washing followed by one or more rinsing operation(s) and drying operation(s).

Next, the process comprises the implementation of a second main step of heat treatment E2 of said substrate resulting from the introduction step E1, comprising at least one coloring chemical element. This heat treatment comprises the implementation of a step of heating the substrate resulting from the preceding step, then a step of maintaining the substrate at a hold temperature for a hold period, before a step of cooling the substrate.

The maximum hold temperature is especially important for performing the function of transfer of the coloring chemical element(s) into the initial substrate. The hold period makes it possible to have an impact on the amount of coloring chemical elements that have diffused and/or have reacted, and thus to modulate the more or less intense final color. This period can thus be chosen according to a very wide range. Finally, the temperature change rates are secondary in the coloring function, and will be chosen to avoid any attack of the initial substrate, in particular to avoid any heat shock.

Advantageously, the hold temperature is between 500° C. and 1850° C., or even between 800° C. and 1400° C.; more particularly, the hold temperature is between 900° C. and 1200° C. for the case of an initial substrate made of monocrystalline alumina comprising a cobalt coating at the outcome of the introduction step E1. The associated hold period may be very long (up to several days); it is advantageously between 0.5 and 48 hours for the particular case of an initial substrate made of monocrystalline alumina comprising a cobalt coating at the outcome of step E1, or even more generally between 0.5 hour and four days.

The heat treatment can be carried out in ambient air. According to one variant, it is carried out in a controlled inert, oxidizing or reducing atmosphere, or even under vacuum. In particular, the heat treatment can be carried out under a nitrogen atmosphere. According to other further variants, the gas flows and pressures can be varied. Furthermore, this second heat treatment step E2 can be carried out in a second piece of equipment distinct from a first piece of equipment provided for carrying out the first introduction step E1. Alternatively, this second step E2 can be carried out in the same piece of equipment as that used for the first introduction step E1.

Figure 2B:
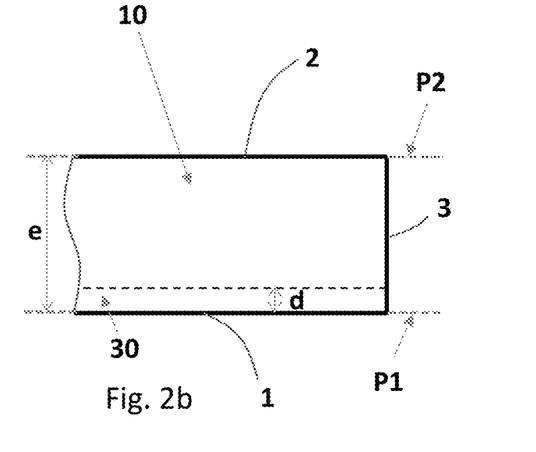

FIG. 2b diagrammatically illustrates the result obtained after heat treatment of the substrate resulting from the first step, represented by FIG. 2a. At the outcome of the heat treatment, a zone of modified chemical composition 30 of thickness d within the volume of the substrate, in the vicinity of the interior surface 1, is obtained. This zone of modified composition performs the coloring function. For example, crystalline alumina of composition $Al_2O_3$, which is initially colorless and transparent, can turn blue with a metered addition of cobalt, by forming a zone of modified composition of $CoAl_2O_4$ and/or can turn green with a metered addition of cobalt by forming a zone of modified composition by substitution of the cobalt in the alumina. According to another example, an addition of magnesium to the alumina $Al_2O_3$ makes it possible to obtain magnesium aluminate $MgAl_2O_4$. According to yet another example, an addition of gold to the alumina $Al_2O_3$ makes it possible to obtain a coloring by plasmon effect. A coloring by the formation of intermetallic compounds can also be envisioned. This step finishes converting the initial substrate into a transparent and colored piece. The zone of modified chemical composition 30 is thus colored and produces, surprisingly, the same visual effect as a glass that would have been colored in the mass, thus throughout its volume, over its entire thickness. However, the zone of modified chemical composition extends only over a very small thickness d, of between 30 and 500 nm, representing on average at most 25% inclusive, or even at most 2% inclusive, or even at most 0.2% inclusive, and preferentially at most 0.07% inclusive of the total thickness e of the timepiece component in the case of a coloring carried out on a single, interior or exterior, surface. The transparent and colored piece thus formed is thus always mainly composed of the transparent material originating from the initial substrate 10, and of a small volume of chemically modified and colored transparent material.

By virtue of the process thus carried out, a transparent and colored piece is obtained, which does not require any reworking of its surface finish, nor even of the treated surface. Indeed, the thickness e' of coating made of coloring chemical element(s) can be provided for in such a way that the coloring chemical element(s) diffuse entirely in the substrate 10 and/or react entirely with the substrate 10 during the heat treatment. Potentially, it is not therefore necessary to remove an excess of coloring chemical element since the process can be provided for in such a way that the entire amount of coloring chemical element is consumed by the process during the heat treatment.

Alternatively, any residue of coloring chemical element at the surface of the piece can if necessary be removed, by any means known to those skilled in the art (stripping, dissolution, chemical attack, polishing, etc.).

At the end of this second step, the process may comprise steps of finalizing the timepiece component, in particular the watch glass. For example, if the initial substrate is not a finished watch glass, for example if it did not have the desired shape, the watch glass can be obtained by machining the transparent and colored piece obtained, in particular by machining the flanks of the glass. By way of example, a wide sapphire sheet can be produced and colored, then machined, for example with a laser, to obtain smaller timepiece components, such as pallets, wheels, glasses, etc. Preferably, a finalizing step does not modify the zone of modified chemical composition within said component.

Alternatively, an additional machining step can be carried out in order to finalize the timepiece component, in particular the watch glass, for example simply to form a bevel or any peripheral part 4, in particular an inclined part, as illustrated by FIGS. 1b to 1e, and/or to form a groove or a single eyeglass or a magnifying lens.

As a variant, this step can consist of the structuring of a feature in the colored transparent piece, for example with a laser, purely for the purposes of decoration or marking. Thus, advantageously, laser etching into the watch glass requires no adaptation of parameters, since it acts on the colorless zone of the glass, that is to say outside the zone of modified chemical composition, regardless of the color of the glass obtained according to the invention.

As a variant, this step can consist in forming a structuring of the colored piece. A "structuring" can form raised and/or set-back zones on at least one exterior or interior surface of the colored piece, so as to create a noticeable relief or else to modify the thickness colored so as to create one or more colored features or features with a color gradient or of the color of the initial substrate. A structuring may be any opening which is not a through-opening, formed at the surface or in the thickness of the colored piece. Such an opening may be a micro-opening or a nano-opening, preferably of sufficiently small size to be invisible or substantially invisible to the naked eye. Alternatively, such an opening may have a larger, macroscopic, size so as to make it intentionally visible. In any event, the openings may have any cross section, not necessary circular. This cross section may in fact be rectangular or star-shaped, for example, or may have any other suitable geometry. Such structuring may in particular be obtained by any conventional machining technique, or by laser machining, in particular by femtosecond laser machining, or by deep reactive ion etching (DRIE) or else by chemical attack. It should be noted that a structuring step could be carried out in the initial phase of the process, directly on the initial substrate provided, before the implementation of the two main steps of the process according to the invention. As a variant, a structuring step may be carried out after the first introduction step E1 of the process, directly on the coating deposited on the substrate, and before the implementation of the second heat treatment step E2 of the process according to the invention.

An additional step may also consist of the assembly of the transparent and colored piece obtained with another component, which may or may not have been obtained by the same process. For example, this additional step may consist in assembling a glass with a single eyeglass or a magnifying lens or in assembling, in particular adhesively bonding, a glass with a support which has a skirt for assembling said glass on a watch case, or in assembling several glasses together.

Finally, the manufacturing process according to the invention has the following advantages:

the introduction of coloring chemical element(s) is perfectly controlled, in terms of amount and localization, thereby making it possible to calibrate it and to repeat it in order to obtain a desired and identical result on each implementation;

likewise, the heat treatment is controlled and repeatable, so as to likewise obtain a desired and identical colored transparent piece on each implementation;

the process is thus compatible with mass production and with timepiece requirements.

The process likewise applies to the manufacture of any transparent timepiece component and makes it possible to manufacture a transparent timepiece component which comprises a substantially planar or curved interior surface, and which comprises mainly a transparent material colored by a zone of modified chemical composition within said component through an introduction of at least one coloring chemical element, this zone of modified chemical composition extending in one part only of the total thickness of the timepiece component, that is to say not over its entire width, this part representing on average at most 25% inclusive, or even at most 2% inclusive, or even at most 0.2% inclusive, and preferentially at most 0.07% inclusive, of the total thickness of the timepiece component, the total thickness of the timepiece component being measured perpendicular to the interior surface of said component or perpendicular to the tangent formed at the apex of the interior surface of said component. Advantageously, the zone of modified chemical composition extends on average over a thickness representing at least 0.0002% of the total thickness of the timepiece component. It should be noted that this thickness of the timepiece component will advantageously be substantially that of the initial substrate.

As an implementation variant, this thickness of the timepiece component can be reduced relative to the initial total thickness of the initial substrate, but in such a way as to preserve the abovementioned ranges of the thickness of the zone of modified chemical composition.

Thus, the invention applies, for example, to the manufacturing of a watch glass, a single eyeglass, a magnifying lens, a part of a backplate, a dial, a date disk, a timepiece movement jewel, pallets, wheels.

By virtue of the process according to the invention, the timepiece component obtained has the following advantages:

the coloring is predictable (in terms of shade, particularly blue, and in terms of saturation), repeatable, and distributed in a desired manner it is either homogeneous over the whole of the intended surface, which may be very large, for example in the case of a sapphire glass, or heterogeneous and controlled, for example according to a controlled gradient, or predefined features or inscriptions. It gives an impression of coloring in the mass, despite the thinness of the zone of modified chemical composition colored. It also gives a visual impression independent of the interior or exterior surface that is treated, and independent of the total thickness of the timepiece component;

transparency is guaranteed, so as to allow, in the case of a watch glass, the time or the indications derived from the time to be read, the dial to be seen, the flange of the case middle to be seen, etc. In addition, this transparency also allows an optional charging (excitation) and discharging (emission) of luminescent material, in particular photoluminescent (phosphorescent and/or fluorescent) material, that would be present under the glass (on/in applied chapters, needles, transfers, etc.);

the overall mechanical strength of the initial substrate is maintained at the output of the process: no deterioration of the mechanical properties is induced by the process;

the hardness of the surface of the initial substrate is maintained at the outcome of the process, on the colored transparent piece;

the appearance of the timepiece component is free of defects, such as one-off non-colored, differently colored or "over-colored" zones, pitting, localized milky appearances, through-porosities, halos. This absence of defects is obtained over the whole surface of the colored transparent piece obtained, which may be large, and can be perfectly seen by a user, optionally even back-lit;

the effects can be modulated by an inclined additional surface, at the level of the flank of the timepiece component, which can, for example, have the shape of a bevel;

other geometrical considerations may modulate these effects, such as raised and/or set-back structured zones on at least one surface of the timepiece component and/or structured zones within the thickness of the timepiece component.

The invention will now be illustrated through the use of a few series of implementation examples.

In a first series of implementation examples, the colorless transparent monocrystalline alumina substrate 10 has a geometry corresponding to a final geometry of a finished watch glass suitable for mounting on a timepiece. This transparent implementation corresponds to the "reference" implementation in the table hereinafter and in the various examples that will follow.

According to this example, the reference watch glass measures 29.5 mm in diameter and has a total thickness of 1.8 mm. It has a geometry similar to that represented in FIG. 1e, with a chamfer on the perimeter of its exterior surface inclined by 36°, over a height f of 0.8 mm, and also a groove and various machinings over the rest of the height of the flank 3. Its exterior and interior surfaces are polished.

The initial substrate, corresponding to the reference watch glass specified above, is washed in a detergent washing bath and then rinsed and dried, then placed in a chamber of a thermal evaporation PVD device. A cobalt metal coating is thus deposited on the interior surface of the initial substrate, which corresponds to the first main step of the process described above.

The deposition speed and time are calibrated in order for the coating to measure a given thickness. The deposit thickness is confirmed by X-ray refractometry. This operation is repeated to form a series of colored pieces comprising several different coating thicknesses e' (setpoint value), which range from 5 to 80 nm, as summarized in the table hereinafter. The heat treatment according to the second main step of the process is carried out identically for all the pieces of the series, with a hold at a temperature of 1060° C. for 2 hours.

Spectrophotocolorimetric measurements, carried out in transmission on the colored pieces resulting from the process according to the embodiment, forming several samples 1.1 to 1.9 at the outcome of the heat treatment step, are performed. The results in the CIELab space are presented in the table hereinafter. The transmittance measurements are carried out between 360 nm and 740 nm with the observer at 2° and the illuminant D65. The luminosity $L^*$, the chromatic values $a^*$ and $b^*$, the saturation $C^*$ and the hue $h^*$ (or hue angle) are measured. The transmittance values (T in %) are recorded at 360 nm and at 460 nm. The Y is a transmission factor; it takes into account the sensitivity of the eye and the type of illumination: it is calculated by the integration of the transmittance spectrum weighted by the human eye response function (which is centered on the green portion of the visible spectrum) and by the spectrum of the illuminant D65 as defined in the "Technical Report of Colorimetry" CIE 15: 2004. These results show in particular that the difference in coating thickness e' has a direct impact on the saturation and the hue of the blue color obtained, in a manner perceptible to the naked eye. At the outcome of the introduction step E1, the glass obtained has an increasingly metallic gray appearance and is less and less transparent, as this thickness e' increases. At the outcome of the heat treatment step E2, the glass has an increasingly saturated blue appearance while at the same time remaining transparent in a cobalt thickness range e' between 5 nm and 45 nm. Beyond this thickness, for the given heat treatment, the transparency and thus the transmittance drop.

For example, for the sample 1.9 (e'=80 nm), the transmittance is equal to:

55.0% at 460 nm, so that the readability through this glass is no longer sufficient, and 38.0% at 360 nm, so that the charging of photoluminescent (phosphorescent and/or fluorescent) material through this glass is no longer sufficient.

In the specific case of this series of examples, it is noted that the samples with a thickness e' of less than or equal to 12 nm allow excellent readability. Those which have a thickness e' of less than or equal to 45 nm allow an acceptable readability. For a thickness e' of 80 nm, the sample allows a hazy reading, since the glass is translucent. For a thickness e' of 80 nm, reading becomes more difficult, since the glass becomes less transparent.

The table below gives the results obtained for the samples of this series according to the first example:

| Sample | e' [nm] | $L^*$ | $a^*$ | $b^*$ | $C^*$ | $h^*$ | T [%] at 360 nm | T [%] at 460 nm | Y [%] | Perceived color |
|---|---|---|---|---|---|---|---|---|---|---|
| Reference | 0 | 93.5 | 0.0 | 0.4 | 0.4 | 87.0 | 82.1 | 83.6 | 86.0 | Colorless |
| 1.1 | 5 | 92.8 | −1.1 | −1.3 | 1.7 | 227.8 | 82.6 | 84.3 | 81.3 | Blue |
| 1.2 | 6 | 92.7 | −1.1 | −1.7 | 2.0 | 235.5 | 82.7 | 84.4 | 82.3 | Blue |

-continued

| Sample | e' [nm] | L* | a* | b* | C* | h* | T [%] at 360 nm | T [%] at 460 nm | Y [%] | Perceived color |
|---|---|---|---|---|---|---|---|---|---|---|
| 1.3 | 8 | 92.4 | −1.5 | −2.1 | 2.6 | 234.7 | 82.6 | 84.4 | 81.4 | Blue |
| 1.4 | 9 | 92.1 | −1.7 | −2.4 | 3.0 | 234.8 | 82.6 | 84.1 | 80.8 | Blue |
| 1.5 | 10 | 91.9 | −1.8 | −2.7 | 3.3 | 235.5 | 82.6 | 84.0 | 80.4 | Blue |
| 1.6 | 12 | 91.5 | −2.0 | −3.2 | 3.8 | 237.9 | 82.9 | 84.0 | 79.7 | Blue |
| 1.7 | 30 | 88.6 | −3.3 | −8.0 | 8.6 | 247.2 | 81.0 | 83.6 | 73.3 | Blue |
| 1.8 | 45 | 86.2 | −5.0 | −11.8 | 12.8 | 247.0 | 78.6 | 83.5 | 68.4 | Blue |
| 1.9 | 80 | 71.7 | −7.7 | −8.0 | 11.1 | 225.5 | 38.0 | 55.0 | 43.2 | Blue-gray |

Figure 3A:
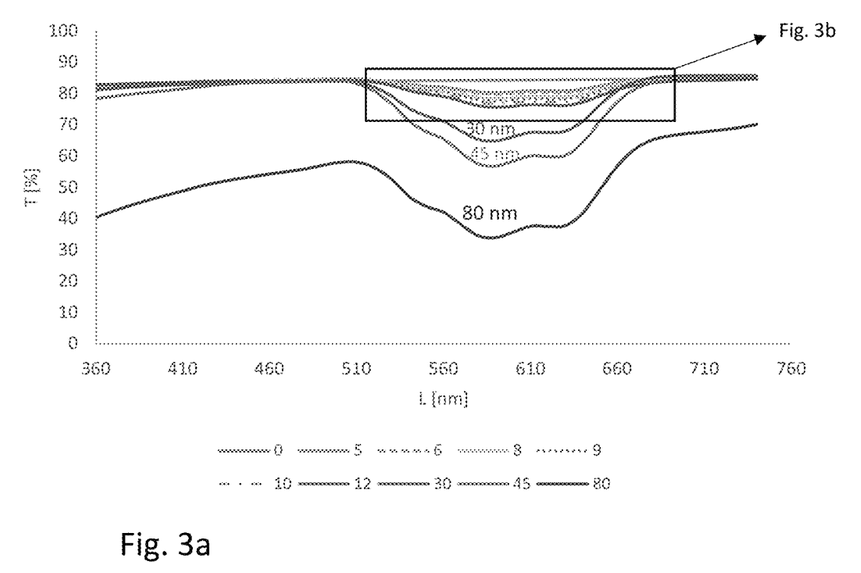
FIG. 3a represents a comparison of the transmittance (T) as a function of the wavelength (L) of various glasses made of sapphire according to a first example, obtained by different variants of the manufacturing process according to the embodiment of the invention.
Figure 3B:
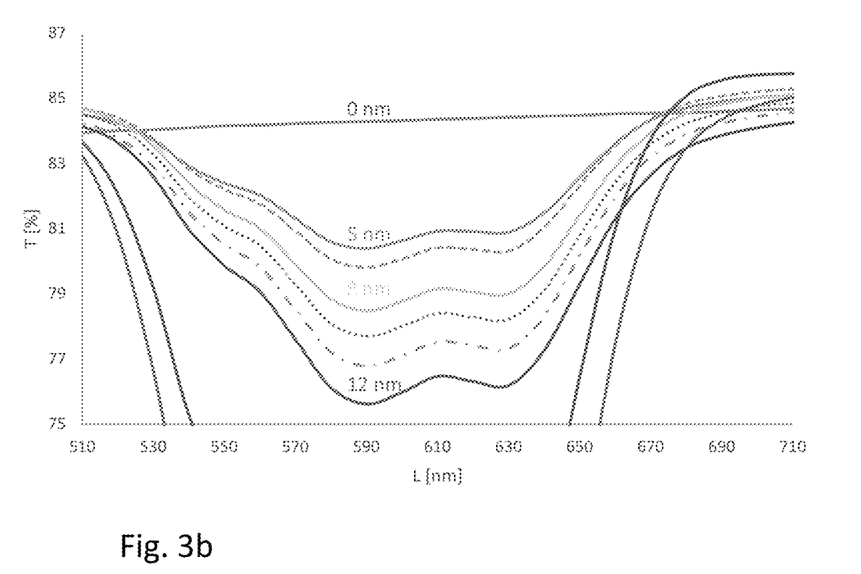
FIG. 3b is a magnification of the above figure.

To illustrate these results, FIG. 3a represents the spectra of transmittance (T in %) as a function of the wavelength (L in nm) for several coating thicknesses according to the series of this first example. FIG. 3b is a magnification of this FIG. 3a.

In addition, it is noted that, when looking at the glass, the coloring appears to be more intense through the peripheral bevel than through its planar exterior surface. In other words, the colored effect is modulated by the angle α. The reason for this lies in the geometry of the piece. This makes it possible to illustrate the advantage of proposing an inclined part at the level of the exterior surface of the glass, as was previously mentioned and is illustrated in FIGS. 1b to 1e.

Figure 3C:
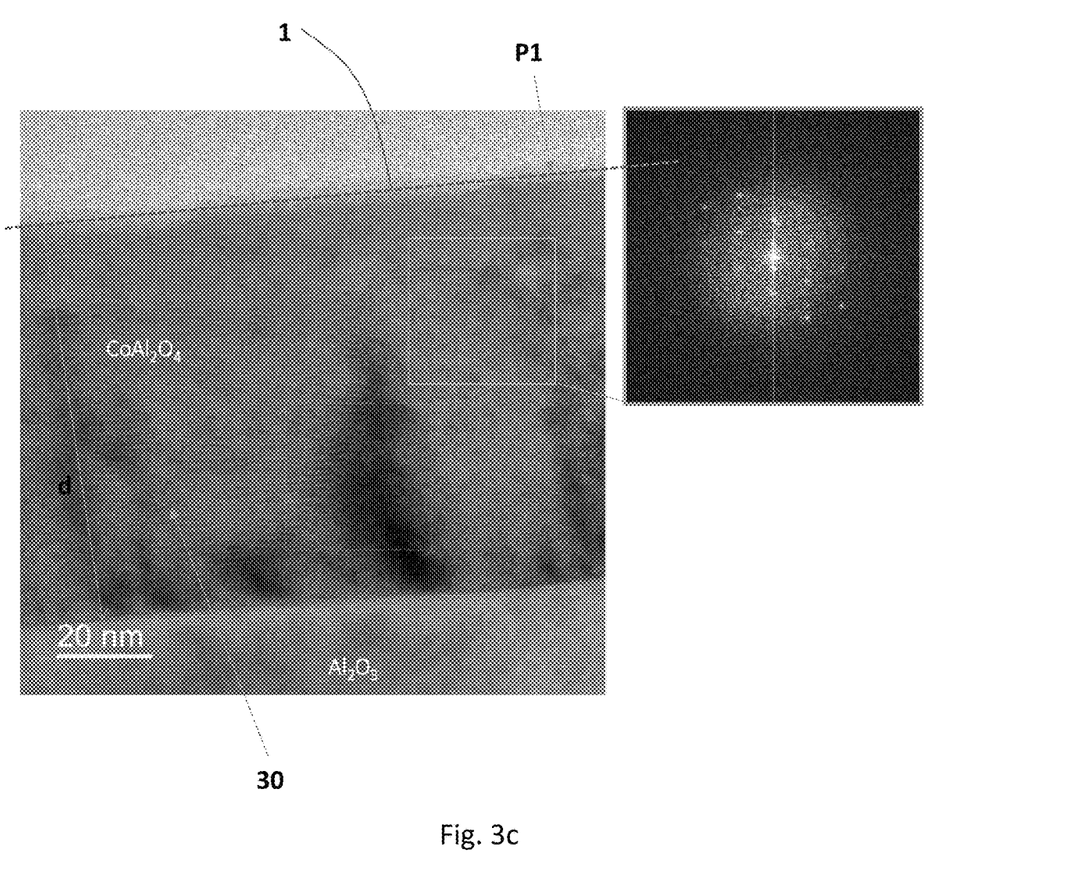
FIG. 3c represents an image taken with a transmission electron microscope (TEM) on a thin section taken from a colored transparent piece at the outcome of the implementation of the manufacturing method according to the embodiment of the invention. An insert represents an electron diffraction image acquired in the zone close to the surface (at a distance from the surface of less than the distance d).

It should be noted that the blue hue observed comes from a chemical reaction of the cobalt, of the alumina and of the oxygen, giving a cobalt aluminate, potentially $CoAl_2O_4$, during the heat treatment, at the level of the zone of modified chemical composition of the colored transparent piece obtained. FIG. 3c is an image taken with a transmission electron microscope (TEM) on a thin section taken by a focused ion beam (FIB) on the colored transparent piece, perpendicular to the interior surface of the colored transparent piece obtained. An insert of this figure shows an electron diffraction image acquired in the zone close to the interior surface treated, and more specifically at a distance less than d from this surface. This image makes it possible to confirm the formation of cobalt aluminate during the phase of coloring the sapphire glass, and also the thickness d.

The overall mechanical properties of the glasses obtained are not degraded by the implementation of the process according to the invention. This result is verified on a batch of additional samples of watch glasses, always taken from the same reference substrate, coated by magnetron sputtering with layers of various thicknesses of cobalt, then heat treated with a hold for three hours at 1000° C. The strength at break and the hardness of the glasses are not in any way affected by the presence of the zone of colored modified chemical composition.

In a second series of implementation examples, the colorless transparent monocrystalline alumina initial substrate 10 used has a geometry corresponding to a final geometry of a finished watch glass, termed reference, in a manner identical to the series according to the first example described above. Samples of colored pieces are formed by varying the heat treatment applied, more specifically by varying the temperature of the three-hour hold. All these samples were previously coated by thermal evaporation with a 10 nm deposit of cobalt metal on the interior surface of the substrate.

The table hereinafter summarizes the results obtained for these examples:

| Sample | Tp [° C.] | L* | a* | b* | C* | h* | T [%] at 360 nm | T [%] at 460 nm | Y [%] | Perceived color |
|---|---|---|---|---|---|---|---|---|---|---|
| Reference | / | 93.5 | 0 | 0.4 | 0.4 | 87.0 | 82.1 | 83.6 | 86.0 | Colorless |
| 2.1 | 900 | 89 | −2.6 | 3.6 | 4.8 | 137.7 | 65.8 | 70.2 | 74.2 | Green |
| 2.2 | 1000 | 91.8 | −1.8 | −2.7 | 3.2 | 236.3 | 81.5 | 83.9 | 80.3 | Blue |
| 2.3 | 1200 | 92 | −1.7 | −2.6 | 3.1 | 236 | 82.9 | 84.1 | 80.7 | Blue |
| 2.4 | 1400 | 94.1 | 0 | 0.1 | 0.2 | 80 | 84.7 | 85.2 | 85.4 | Colorless |

Figure 4:
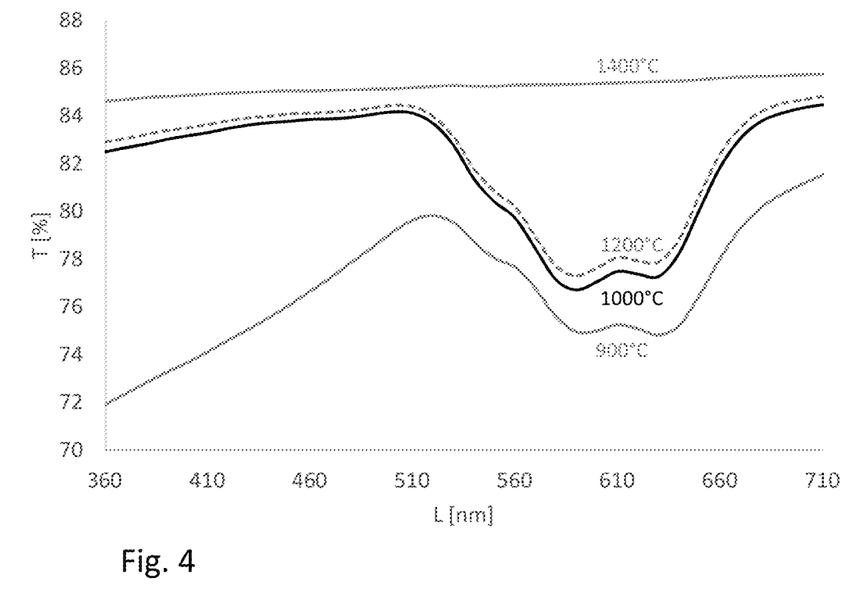
FIG. 4 represents the transmittance (T) as a function of the wavelength (L) of various sapphire glasses according to a second example, obtained by different variants of the manufacturing process according to the embodiment of the invention.

Additionally, FIG. 4 represents the spectra of transmittance (T in %) as a function of the wavelength (L in nm) for several hold temperatures (Tp in ° C.) according to the series of this second example.

It is noted in particular that samples 2.1 to 2.3 have a hue angle which increases with the hold temperature, and that sample 2.1 is green whereas samples 2.2 and 2.3 are blue. Above a treatment at 1400° C. (samples 2.4), the sapphire glass becomes transparent and colorless, similar to a non-treated sapphire glass (reference sample).

A third series of implementation examples makes it possible to obtain samples in a manner similar to the second series, but while varying the duration of the heat-treatment hold applied from 30 minutes to 48 hours, for a hold temperature always equal to 900° C. All these samples were coated beforehand by thermal evaporation with a 5 nm deposit of cobalt metal on the interior surface of the substrate.

The table hereinafter summarizes the results obtained for these samples:

| Sample | t [h] | L* | a* | b* | C* | h* | T [%] at 360 nm | T [%] at 460 nm | Y [%] | Perceived color |
|---|---|---|---|---|---|---|---|---|---|---|
| Reference | 0 | 93.5 | 0.0 | 0.4 | 0.4 | 87.0 | 82.1 | 83.6 | 86.0 | Colorless |
| 3.1 | 0.5 | 90.2 | −1.6 | 3.3 | 3.7 | 116.3 | 70.2 | 74.4 | 78.3 | Gray-green |
| 3.2 | 1 | 92.3 | −1.4 | 0.4 | 1.5 | 165.6 | 77.1 | 81.1 | 81.4 | Green |
| 3.3 | 3 | 92.9 | −1.0 | −1.3 | 1.6 | 230.3 | 81.9 | 84.5 | 82.7 | Blue |
| 3.4 | 48 | 93 | −1.0 | −1.3 | 1.6 | 234.6 | 82.8 | 84.7 | 82.8 | Blue |

Figure 5:
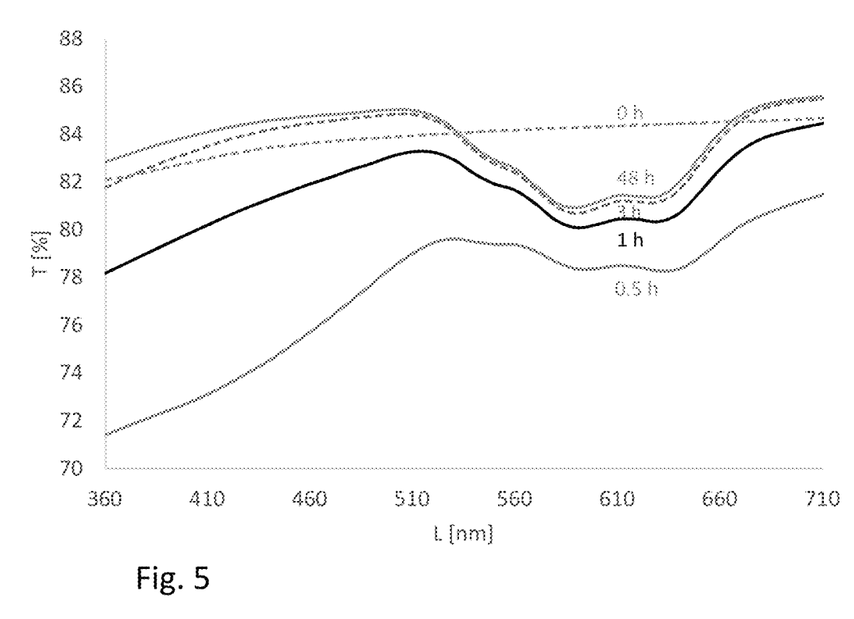
FIG. 5 represents the transmittance (T) as a function of the wavelength (L) of various sapphire glasses according to a third example, obtained by different variants of the manufacturing process according to the embodiment of the invention.

Additionally, FIG. 5 represents the spectra of transmittance (T in %) as a function of the wavelength (L in nm) for several hold times (t in h) according to the series of this third example.

It is noted in particular that, as the duration of the heat treatment increases, the coating reacts more efficiently with the glass, which results in an increase in the transmittance and the establishment of the blue color. After a heat-treatment hold of three hours (example 3.3), the sapphire glass is blue and sufficiently transparent in the wavelengths which allow both good readability and optional charging and discharging of photoluminescent material.

In a fourth series of implementation examples, the initial substrate 10 used always corresponds to the reference finished watch glass, in a manner identical to the series according to the first example described above. Examples are carried out by varying the heat treatment applied, more specifically the temperature and/or the duration of the hold that are applied. All these samples are implanted with iron, cobalt or titanium beforehand, by an ion-beam ion implantation process (direct implantation of the ions of the ion beam).

The table below summarizes the results obtained by means of these samples:

The hardness and elastic modulus values obtained by nanoindentation on the samples forming the series of this fourth example make it possible to conclude that the mechanical properties (hardness and elasticity) of the sapphire glass are not influenced by the coloring process involving the ion implantation and the heat treatments, under the conditions tested.

In a fifth series of implementation examples, the colorless, transparent, monocrystalline alumina initial substrate 10 used has a geometry corresponding to a final geometry of a finished watch glass, termed reference watch glass, in a manner identical to the series according to the first example described above.

The initial substrate, corresponding to the reference watch glass, is washed in a detergent washing bath, then rinsed and dried, then placed in a chamber of a thermal evaporation PVD device. A cobalt metal coating is thus deposited on the interior surface 1 or exterior and beveled surface 2+4, of the initial substrate. This operation is repeated so as to form a series of colored pieces comprising several different coating thicknesses e' (setpoint value), of 3, 6 or 9 nm, as summarized in the table hereinafter. The recall implantation is carried out in a similar manner for all the pieces of the series, in one and the same piece of equipment, by the plasma

| Sample | Implantation | Heat treatment | L* | a* | b* | C* | h* | T (%) 360 nm | T (%) 460 nm | Y [%] | Perceived color |
|---|---|---|---|---|---|---|---|---|---|---|---|
| Reference | None | none | 94.2 | 0.1 | 0.2 | 0.2 | 69.7 | 85.3 | 85.6 | 85.8 | Colorless |
| 4.1 | Iron | none | 75.2 | 0.4 | 7.5 | 7.5 | 86.9 | 32.0 | 42.4 | 48.5 | Brown |
| 4.2 | Iron | 900° C. 30 min | 86.3 | 2.0 | 16.7 | 16.8 | 83.3 | 36.5 | 52.7 | 68.5 | Orange |
| 4.3 | Iron | 1000° C. 3 h | 87.0 | 1.9 | 16.7 | 16.8 | 83.5 | 42.1 | 53.7 | 70.0 | Orange |
| 4.4 | Iron | 1600° C. 3 h | 94.1 | 0.0 | 0.1 | 0.1 | 80.0 | 85.0 | 85.2 | 85.4 | Colorless |
| 4.5 | Cobalt | 900° C. 30 min | 86.5 | −2.7 | 5.5 | 6.1 | 116.0 | 57.5 | 62.9 | 69.0 | Gray-green |
| 4.6 | Cobalt | 1000° C. 3 h | 92.0 | −1.8 | −2.9 | 3.4 | 238.5 | 83.0 | 84.7 | 80.8 | Blue |
| 4.7 | Cobalt | 1600° C. 3 h | 94.2 | 0.0 | 0.2 | 0.2 | 84.6 | 85.3 | 85.5 | 85.7 | Colorless |
| 4.8 | Titanium | 900° C. 30 min | 91.8 | −3.6 | 5.7 | 6.7 | 121.9 | 41.2 | 74.1 | 80.3 | Yellow |
| 4.9 | Titanium | 1000° C. 3 h | 91.8 | −5.0 | 10.1 | 11.3 | 116.5 | 37.4 | 69.1 | 80.2 | Yellow |

Figure 6A:
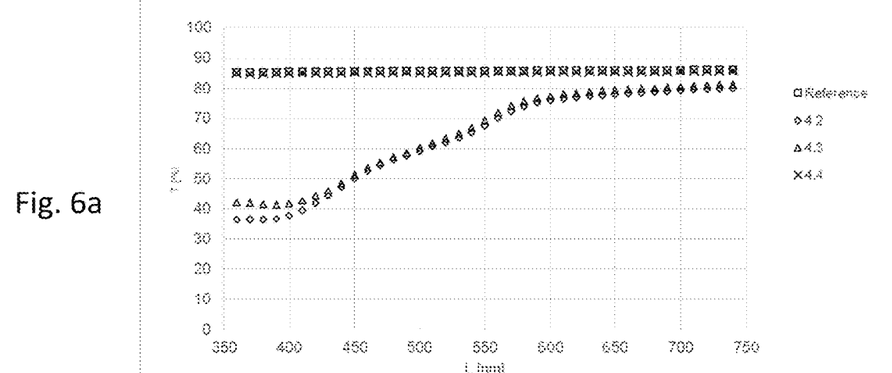
FIGS. 6a to 6c represent the transmittance (T) as a function of the wavelength (L) of various sapphire glasses according to a fourth example, obtained by different variants of the manufacturing process according to the embodiment of the invention.
Figure 6B:
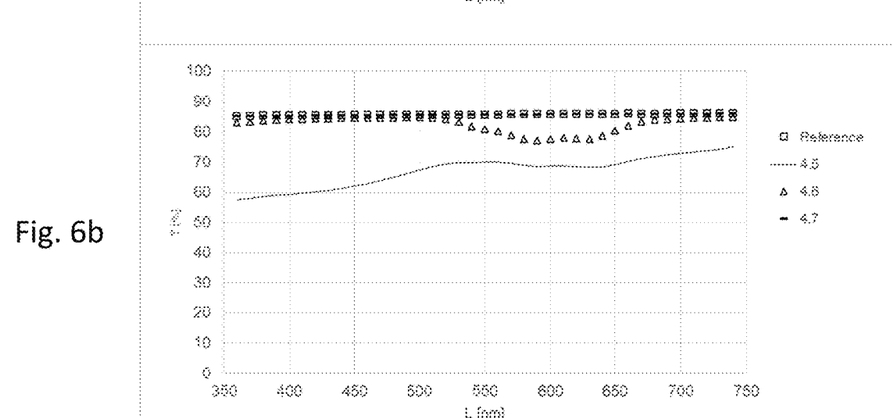
Figure 6C:
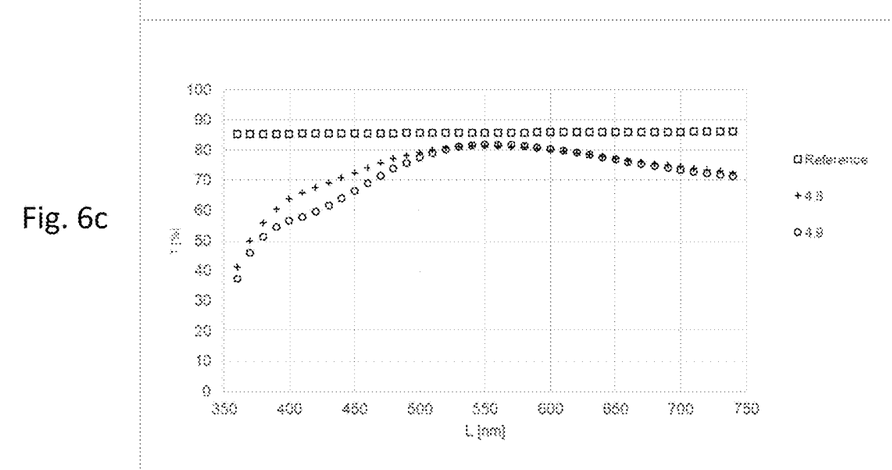

Additionally, FIGS. 6a to 6c represent the spectra of transmittance (T in %) as a function of the wavelength (L in nm) for the samples forming the series of this fourth example.

It is noted in particular that iron gives an orangey color (at 900° C. and 1000° C.), that cobalt gives a gray color at 900° C. and a blue color at 1000° C., and titanium gives a slight yellowing (at 900° C. and 1000° C.). Whether it is with iron or cobalt, the treatment at 1600° C. gives a transparent and colorless glass.

immersion method, with argon ion bombardment; only the dose of implanted ions (D expressed in atoms/cm² with an energy of 10 kV) changes, as summarized in the table hereinafter. These operations correspond to the first main step of the process described above.

The heat treatment according to the second main step of the process is carried out in an identical manner for all the pieces of the series, with a hold at a temperature of 1000° C. for 3 hours.

The table hereinafter summarizes the results obtained for these samples:

| Sample | e' [nm] | D Dose [at/cm²] | Surface | L* | a* | b* | C* | h* | T [%] at 360 nm | T [%] at 460 nm | Y [%] | Perceived color |
|---|---|---|---|---|---|---|---|---|---|---|---|---|
| Reference | 0 | / | / | 93.5 | 0.0 | 0.4 | 0.4 | 87.0 | 82.1 | 83.6 | 86.0 | Colorless |
| 5.1 | 3 | $3.0 \cdot 10^{15}$ | 1 | 93.4 | −0.6 | −0.9 | 1.0 | 236.4 | 83.4 | 85.2 | 83.9 | Blue |
| 5.2 | 6 | $1.0 \cdot 10^{16}$ | 1 | 93.2 | −0.8 | −1.6 | 1.8 | 242.4 | 84.0 | 85.6 | 83.4 | Blue |
| 5.3 | 9 | $1.0 \cdot 10^{16}$ | 1 | 92.0 | −1.8 | −2.3 | 2.9 | 233.0 | 81.6 | 83.9 | 80.8 | Blue |
| 5.4 | 3 | $3.0 \cdot 10^{15}$ | 2 + 4 | 93.4 | −0.6 | −0.8 | 1.0 | 236.3 | 83.4 | 85.2 | 84.0 | Blue |
| 5.5 | 6 | $1.0 \cdot 10^{16}$ | 2 + 4 | 93.2 | −0.7 | −1.5 | 1.6 | 245.4 | 84.3 | 85.4 | 83.4 | Blue |
| 5.6 | 9 | $1.0 \cdot 10^{16}$ | 2 + 4 | 92.2 | −1.7 | −2.3 | 2.9 | 234.2 | 82.1 | 84.3 | 81.1 | Blue |

Figure 7:
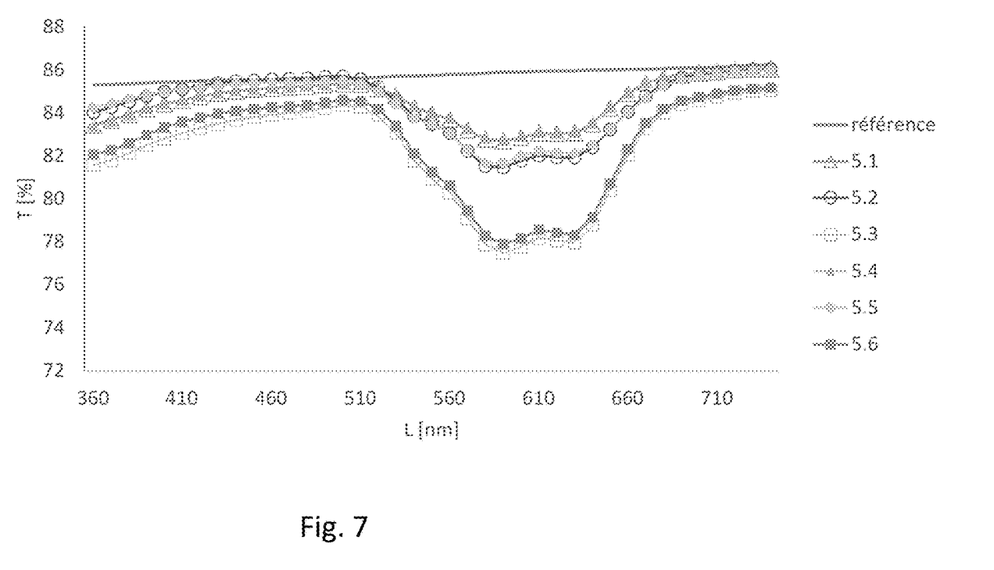
FIG. 7 represents the transmittance (T) as a function of the wavelength (L) of various sapphire glasses according to a fifth example, obtained by different variants of the manufacturing process according to the embodiment of the invention.

Additionally, FIG. 7 represents the spectra of transmittance (T in %) as a function of the wavelength (L in nm) for several values of coating thicknesses e' and implanted-ion doses D according to the series of this fifth example.

It is noted in particular that the samples obtained are blue; samples 5.1 to 5.3 and 5.4 to 5.6 have a saturation C* which increases with the coating thickness e'. With identical treatment parameters, the results are similar regardless of the surface treated (surface 1 or surfaces 2+4).

The sixth example focuses in particular on the impact of a colored watch glass, which is blue in this example, on the charging (excitation) and discharging (emission) performance qualities of a photoluminescent material that would be placed on a dial under the interior surface of the watch glass. A blue glass (sample 6) is prepared according to the embodiment wherein a cobalt deposit of 9 nm is produced by thermal evaporation on a colorless, transparent, monocrystalline alumina substrate 10, and followed by heat treatment comprising a hold of 2 hours at 1060° C.

The results of spectrophotocolorimetric measurements in transmission carried out on sample 6 and on the reference glass are given in the table below.

The results clearly illustrate the advantages obtained by means of the process of the invention. On this basis, those skilled in the art will know how to adjust the deposit thicknesses e', the materials to be used, and the heat treatment parameters as a function of the result that it is desired to achieve, in particular in terms of color and transparency. In particular, it will be advantageous to choose to achieve a transmission factor (Y) of greater than or equal to 68% inclusive, or even greater than or equal to 79% inclusive. A substrate may also be chosen such that the timepiece component obtained has an average hardness of the exterior surface of greater than or equal to 30 GPa and/or of greater than or equal to 2016 HV0.2, in particular in the case of a watch glass.

The invention claimed is:

1. A timepiece comprising a watch case and a transparent timepiece component which is a watch glass assembled with the watch case, the watch glass comprising:
   a substantially planar or curved interior surface, the interior surface being oriented towards an inside of the watch case,

| Sample | e' [nm] | L* | a* | b* | C* | h* | T (%) 360 nm | T (%) 460 nm | Y [%] | T [° C.] | d [h] | Perceived color |
|---|---|---|---|---|---|---|---|---|---|---|---|---|
| Reference | 0 | 93.5 | 0.0 | 0.4 | 0.4 | 87.0 | 85.3 | 85.6 | 86.0 | — | — | Colorless |
| 6 | 9 | 92.1 | −17 | −2.4 | 2.9 | 235.1 | 82.7 | 84.3 | 80.9 | 1060 | 2 | Blue |

The two glasses (reference glass and glass sample 6) are shown successively on the same watch, comprising applied markers and hands with a commercial photoluminescent material. The luminous performance quality of the assembly with the blue glass (sample 6) and with the reference glass are compared after having kept the watch in the dark for more than 24 hours, followed by a standardized illumination (20 minutes at 400 lux with illuminant D65). The luminescence decrease [nCd] as a function of the time kept in the dark is measured by photometry. The relative decrease in luminance performance quality of the blue glass (sample 6) is evaluated as percentage of the luminous intensity of the reference glass.

The relative decrease in luminous performance quality due to the coloring of the sample 6 is 0.8% from 0 to 8 hours and 1.7% from 0 to 22 hours. In comparison with a colorless reference glass, the use of a blue glass according to example 6 therefore has no influence, that can be seen by the individual wearing the watch, on the performance qualities of the photoluminescent material tested.

Naturally, the above examples are carried out in a non-limiting manner, in order to illustrate the results obtained with the implementation of the concept of the invention. They could be reproduced on any transparent timepiece component other than a watch glass, with similar effects.

an exterior surface opposed to the interior surface, the exterior surface being oriented towards an outside of the watch case,
a peripheral lateral surface linking the exterior surface and the interior surface, and
mainly a transparent material, wherein the transparent material is an inorganic and/or mineral material or a material composed at least partially of inorganic and/or mineral matter,
wherein the transparent material is colored by a zone of modified chemical composition within the timepiece component through an introduction of at least one coloring chemical element into the transparent material, wherein the at least one coloring chemical element is selected from the group consisting of metals, metal oxides, metal compounds, metal alloys, transition metals, transition metal oxides, metalloids, non-metals, and gases,
wherein the zone of modified chemical composition extends in only an interior surface layer having a thickness representing on average at most 25% of a total thickness of the timepiece component, the interior surface layer including the interior surface, wherein the zone of modified chemical composition does not extend to the exterior surface, wherein, in the zone of modified chemical composition observed from outside of the exterior surface, (i) a color is seen as uniform on at least a portion of the exterior surface and at least a portion of the lateral surface, the portion of the exterior surface and the portion of the lateral surface having an inclination in a range of from 10 degrees to 60 degrees relative to each other, and/or (ii) a color is seen as forming a color gradient on at least a portion of the exterior surface, wherein the zone of modified chemical composition includes a gradient of thickness that modulates a watch glass coloring effect to obtain (i) the color seen as uniform on the at least one portion of the exterior surface and the at least one portion of the lateral surface, and/or (ii) the color seen as forming the color gradient on the at least one portion of the exterior surface.

2. The timepiece as claimed in claim 1, wherein the zone of modified chemical composition extends on the side of the interior surface over a thickness representing on average at least 0.0002% of the total thickness of the timepiece component.

3. The timepiece as claimed in claim 1, wherein the at least one coloring chemical element is selected from the group consisting of cobalt, iron, chromium, gold, titanium, vanadium, copper, manganese, magnesium, zinc, silver, boron, and nitrogen.

4. The timepiece as claimed in claim 1, wherein
the zone of modified chemical composition comprises cobalt aluminate and/or cobalt so that the timepiece component has a blue and/or green color, or
the zone of modified chemical composition comprises gold so that the timepiece component has a pink or red color.

5. The timepiece as claimed in claim 1, wherein the interior surface has an area greater than or equal to 20 mm$^2$ and the timepiece component has a thickness greater than or equal to 0.85 mm.

6. The timepiece as claimed in claim 5, wherein at least one of the following:
the timepiece component is transparent, so as to allow indications to be read through the thickness of the component, and/or charging and/or discharging of a photoluminescent material through the thickness of the component, and/or
the timepiece component comprises a transmission factor greater than or equal to 68%.

7. The timepiece as claimed in claim 6, wherein at least one of the following:
the timepiece component comprises raised and/or setback structured zones on at least one surface of the timepiece component,
the timepiece component comprises structured zones within the thickness of the timepiece component.

8. The timepiece as claimed in claim 7, wherein an area of the portion of the lateral surface having an inclination of from 10 degrees or more to 60 degrees relative to the portion of the exterior surface represents from 1% to 30% of an area of the interior surface.

9. The timepiece as claimed in claim 1, wherein the interior surface has an area greater than or equal to 80 mm$^2$, and the timepiece component has a thickness in a range of from 0.2 mm to 15 mm.

10. The timepiece as claimed in claim 1, wherein, in the zone of modified chemical composition observed from outside of the exterior surface, the color is seen as uniform on at least the portion of the external surface and the portion of the lateral surface having an inclination in the range of from 10 degrees to 60 degrees relative to each other.

11. The timepiece as claimed in claim 1, wherein, in the zone of modified chemical composition observed from outside of the exterior surface, the color is seen as forming the color gradient on at least the portion of the external surface.

12. A process for manufacturing a colored and transparent timepiece, wherein the process comprises:
a) providing an initial substrate which comprises a substantially planar or curved interior surface composed mainly of a transparent material;
b) introducing at least one coloring chemical element via at least one exterior or interior surface of the initial substrate;
c) performing heat treatment of the substrate resulting from the introducing and comprising at least one coloring chemical element,
so as to obtain the timepiece as claimed in claim 1 wherein the timepiece component is a transparent and colored piece.

13. The process as claimed in claim 12, wherein the introducing comprises at least one of the following:
depositing a coating comprising at least one coloring chemical element on at least one surface of the initial substrate, and/or
performing recoil ion implantation of at least one coloring chemical element.

14. The process as claimed in claim 13, wherein the introducing comprises depositing a coating having a thickness in a range from 1 nm to 10 µm.

15. The process as claimed in claim 12, wherein the introducing comprises depositing a coating and before the depositing, masking a surface of the substrate so as to prevent the substrate from receiving the coating and/or so as to form the coating having a variable thickness.

16. The process as claimed in claim 12, wherein the heat treatment comprises a hold at a hold temperature in a range of from 500° C. to 1850° C., for a duration in a range of from 0.5 hour to four days.

17. The process as claimed in claim 12, wherein the process comprises all or some of the following additional actions:
a) machining the transparent and colored piece so as to form the timepiece component;
b) machining at least one surface of the transparent and colored piece so as to modify a shape of the timepiece component and/or to form a feature of the timepiece component and/or to form a lateral surface inclined relative to an exterior surface of the timepiece component, having an inclination greater than or equal to 10 degrees relative to the direction perpendicular to the interior surface, so as to modulate the timepiece component coloring effect;
c) assembling the transparent and colored piece with another timepiece component;
d) removing a residue of coloring chemical element from a surface of the transparent and colored piece; and/or
e) etching a feature into the timepiece component.

* * * * *